United States Patent [19]
Weiss et al.

[11] B 4,001,046
[45] Jan. 4, 1977

[54] THERMOELEMENT ON SEMICONDUCTOR BASE

[75] Inventors: Herbert Weiss, Munich; Otto Maurer, Worth; Peter Kolbow, Minfeld, all of Germany

[73] Assignee: Siemens Aktiengesellschaft, Berlin & Munich, Germany

[22] Filed: Sept. 21, 1973

[21] Appl. No.: 399,632

[44] Published under the second Trial Voluntary Protest Program on March 9, 1976 as document No. B 399,632.

[30] Foreign Application Priority Data

Sept. 29, 1972 Germany .................... 2247962

[52] U.S. Cl. ................................. 136/205; 357/15; 357/87
[51] Int. Cl.² ................................. H01L 35/04
[58] Field of Search ................ 136/205, 224, 225; 357/15, 87

[56] References Cited

UNITED STATES PATENTS

| | | | |
|---|---|---|---|
| 3,280,391 | 10/1966 | Bittmann et al. | 357/15 |
| 3,460,008 | 8/1969 | Dahlberg | 357/87 X |
| 3,504,240 | 3/1970 | Dahlberg | 357/87 X |
| 3,706,014 | 12/1972 | Dean | 357/15 |

*Primary Examiner*—Verlin R. Pendegrass
*Attorney, Agent, or Firm*—Hill, Gross, Simpson, Van Santen, Steadman, Chiara & Simpson

[57] ABSTRACT

A thermoelement arrangement on a semiconductor base. Individual such arrangements may be on the order of a few microns in size.

12 Claims, 5 Drawing Figures

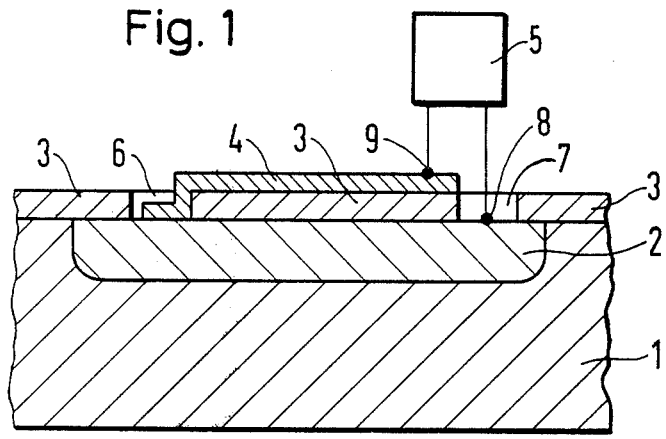
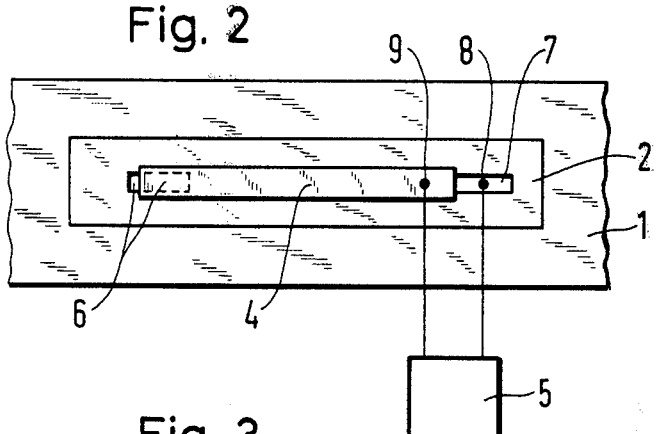
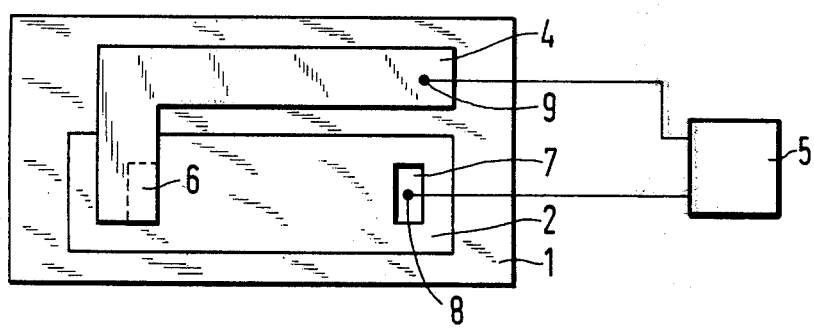

THERMOELEMENT ON SEMICONDUCTOR BASE

BACKGROUND OF THE INVENTION

Thermoelements on a semiconductor base are known. They consist, for example, of two small semiconductor blocks of different conductivity type interconnected by a metal U-shaped element. When the exposed respective block ends are heated by the thermal radiation which is to be measured, a thermo-voltage is generated which may be tapped at the opposed respective block. This voltage is proportional to the temperature increase due to the converted radiation power. These thermoelements on a semiconductor base are actually relatively sensitive, but, as a result of their mass, they exhibit a thermal inertia which prevents them from following relatively rapid changes in intensity in the oncoming radiation.

The thermovoltage emitted by an individual thermoelement, which lies in the region of millivolts, requires a high amplification to raise it to a signal level required for display, or further measured value processing. Since a high d.c. voltage amplification involves a number of practical problems, frequently multiple thermoelements consisting of series-connected individual elements are employed in thermoelements; in such an arrangement, the output voltage corresponds to the sum of all the individual element thermovoltages. It is, however, necessary for each of the individual elements to receive the same radiation power if the temperature of a homogeneous radiation source is to be measured. In practice, this is very difficult if not impossible to achieve, particularly in the case of radiation pyrometers, in which the object to be measured is to be portrayed on the relatively large receiver surface of a multiple thermoelement.

BRIEF SUMMARY OF THE INVENTION

The present invention provides a thermoelement arrangement on a semiconductor base having a high degree of sensitivity and a low thermal inertia which is suitable for the production of multiple thermoelements and whose geometric dimensions may be as small as possible. In a thermoelement arrangement of this invention, a semiconductor zone, an electrically insulating layer, one conductor path, and two terminal contacts are provided. The conductor path is electrically conductively connected at its one end to the semiconductor zone, and the electrically insulating layer is arranged outside this connection between the conductor path and semiconductor zone.

Preferably, the semiconductor zone is a doped zone of a semiconductor body, and preferably the electrically insulating layer contains two recesses. In the one recess the conductor path is electrically conductively connected to the semiconductor zone, and in the other recess a terminal contact is provided between the semiconductor zone and a further terminal.

BRIEF DESCRIPTION OF DRAWINGS

In the drawings:

FIG. 1 schematically illustrates a vertical sectional view of one embodiment of a single thermoelement arrangement of this invention;

FIG. 2 schematically illustrates a top plan view of the embodiment of FIG. 1 with layer 3 removed for purposes of improving clarity;

FIG. 3 schematically illustrates a top plan view of another embodiment of thermoelement arrangement of this invention;

DETAILED DESCRIPTION

Figure 4:
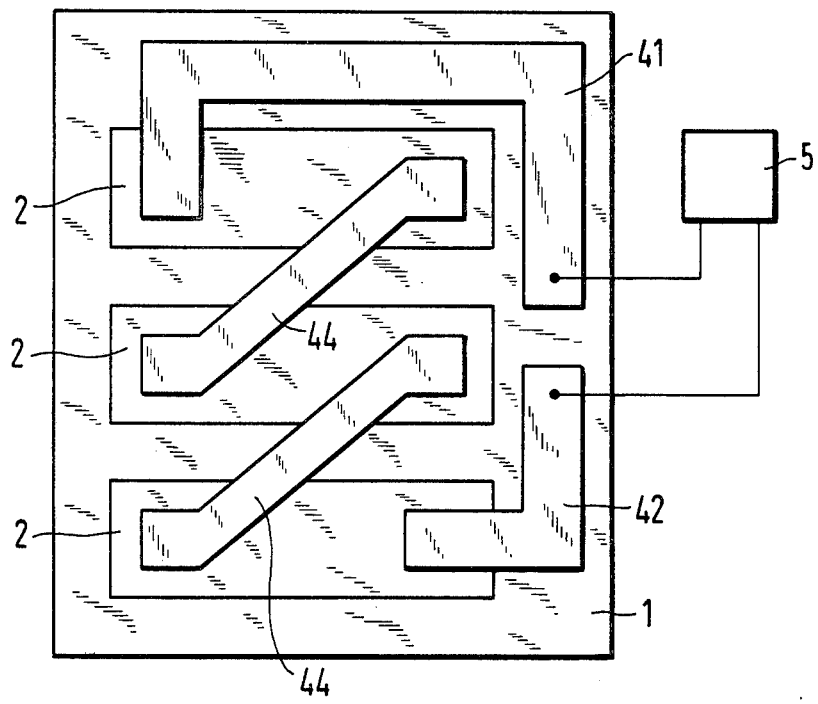
FIG. 4 schematically illustrates a top plan view of another embodiment of this invention comprising a series connection of three thermoelement arrangement of invention, and FIG. 5 schematically illustrates a vertical sectional view of another embodiment of a single thermoelement arrangement of this invention.

In FIGS. 1 and 2, there is seen a thermoelement arrangement of the present invention wherein a semiconductor body 1 has doped zone 2. Body 1 preferably comprises n-silicon and doped zone 2 preferably then possesses p-doping. Body 1 has a thickness preferably of about 200 microns, and doped zone 1 (which can be provided by diffusion) has a thickness preferably of about 1 to 2 microns, although thicker and thinner such thicknesses may be employed without departing from the spirit and scope of the invention.

An electrically insulating layer 3 is arranged on doped zone 2 and on the surface of the n-silicon semiconductor body 1. This layer 3 preferably consists of $SiO_2$ and is preferably about 2 microns thick, although such may be thicker or thinner without departing from the spirit and scope of this invention. A pair of recesses or apertures 6 and 7 are provided in layer 3, such layer 3 and recesses 6 and 7 can be conveniently, and preferably are formed with the aid of photolithographic processing steps.

Above or over zone 2 lies a conductive path 4 which is separated from the zone 2 by the layer 3 as shown in FIGS. 1 and 2, and zone 2 is electrically connected to conductive path 4 in recess 6. Conductive path 4 is preferably metallic and more preferably is aluminum, and path 4 preferably has a thickness of about 1 micron, although such thickness may be greater or smaller without departing from the spirit and scope of this invention. The interconnection between path 4 and zone 6 in recess 6 can be considered to correspond to the one soldered seam of a conventional thermoelement formed by soldering wires together. Path 4 is conveniently and preferably applied by vapor deposition. Preferably path 4 extends from recess 6 to a position shortly before recess 7.

In this recess 7 on zone 2 is arranged a terminal contact point 8, and on path 4 near recess 7 is arranged aa terminal contact point 9. A thermovoltage measuring instrument 5 is interconnected by conductors between the respective terminal contact points 8 and 9. FIG. 3 shows a further development of a thermoelement arrangement in accordance with the invention in which a conductive path 4 is arranged laterally adjacent a doped diffusion zone 2. The conductive path 4 likewise leads from a recess 6 to the vicinity of a recess 7. An electrically insulating layer is arranged between the metal conductive path 4 and does not show in FIG. 3.

FIG. 4 illustrates an assembly comprising a plurality of single thermoelement arrangements as described above in reference to FIGS. 1 and 2, and FIG. 3, wherein such individual thermoelement arrangements are interconnected together in a series arrangement. Here the respective semiconductor zones 2, the electric insulating layers (not showing but beneath the conductive paths) and the conductive paths such as 44, 42 and 41 are conveniently and preferably simultaneously produced by the same processing as indicated above. The zones 2 are arranged on a semiconductor body 1 each zone 2 being preferably about 10 microns wide, although wider and narrower such widths may be employed without departing from the spirit and scope of this invention. The respective spacings between adjacent zones 2 are preferably about identical to one another and may be somewhat less than 10 microns in respective widths, although wider and narrower such spacings may be employed without departing from the spirit and scope of this invention.

The individual series connected thermoelements are connected to one another by the respective metal paths 44. The measuring instrument 5 and its pair of conductors or leads is connected to the first thermoelement in the series with the aid of the metal conductor paths 41, and to the last thermoelement in the series with the aid of the conducting path 42.

When the semiconductor zones 2 each possess a width of about 10 microns and are each spaced from each other by about 10 microns, and when the semiconductor body possesses a length of about 1 millimicron thermoelements connected to one another in series are accommodated on a single body 1. In such a multiple thermoelement, in spite of heat discharge, thermovoltages of approximately 10 millivolts/°C can be achieved.

In the above described thermoelement arrangements in accordance with the invention, the semiconductor zone 2, which is, as indicated, p-doped silicon, is electrically practically insulated from the n-silicon body by a pn-junction. On the heating of the contact point in a recess 6 between the conductor path and the diffusion zone, the temperature increase may be measured very rapidly, since both the p-zone and the conductor path possess a thickness of only approximately 1 millimicron and therefore the mass to be heated is extremely small. The time constant of a thermoelement constructed in the manner described above is not more than about 10 microseconds.

Figure 5:
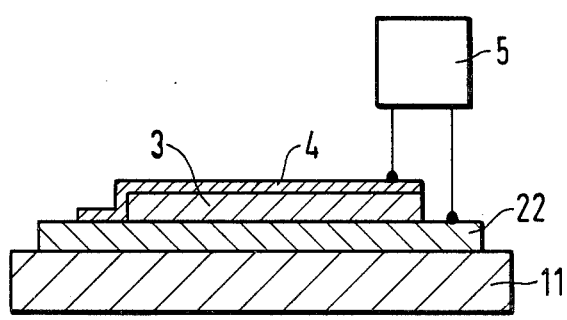

In the event that, in the above example, the thermal coupling between a semiconductor zone 2 and a n-silicon body 1 is too great, or in the event that the electrical insulation between these respective members 2 and 1 is to be improved, the following further development of a thermoelement arrangement in accordance with the invention may be applied as illustrated in FIG. 5 schematically. In this FIG. 5 embodiment, elements like those earlier described bear the same reference signs. The doped semiconductor zone 22 is applied to an insulating carrier substrate 11 in order to improve its thermal eletric insulation from its enviroment. Preferably the thickness of such semiconductor zone 22 is about 2 microns but larger and smaller thicknesses may be employed without departing from the spirit and scope of this invention. The semiconductor zone 22 preferably comprises p-doped silicon and is applied to the insulating carrier substrate 11 by vapor deposition. This carrier substrate 11 preferably consists of spinel, sapphire, or the like. The sensitivity of such a thermoelement arrangement is particularly high. In the case of an individual thermoelement constructed as described above, the sensitivity is about 500 micron volts/°C.

Thermoelement arrangements constructed as described in FIG. 5 may also be multiply connected. In this case the individual thermoelements are preferably arranged on a common spinel or sapphire carrier substrate, analogously to the assembly of FIG. 4.

Other and further embodiments and variations of the present invention will become apparent to those skilled in the art from a reading of the present specification taken together with the drawings, and no undue limitations are to be inferred or implied from the present disclosure.

We claim:

1. A two-pole thermoelement arrangement consisting essentially of a semiconductor base, a semiconductor zone, an electrically insulating layer, a conductive path and two terminal contacts, said conductive path being elongated and electrically conductively connected at one end thereof to said semiconductor zone with the remainder of said conductive layer being arranged on said electrically insulating layer, said electrically insulating layer being positioned outside such connection between said conductive path and said semiconductor zone, said semiconductor zone being a doped elongated zone adjacent one face of said semiconductor base, said electrically insulating layer being elongated and arranged in generally adjacent relationship to said semiconductor zone, one of said terminal contacts being on the opposite end of said conductive path, the other of said terminal contacts being on said semiconductor zone in a region thereof generally adjacent said one terminal contact but generally remote from such connection.

2. The thermoelement arrangement of claim 1, wherein said conductive path is arranged above said semiconductor zone and leads to said other recess.

3. The thermoelement arrangement of claim 1, wherein said conductive path is arranged in part over said semiconductor zone and in part adjacent said semiconductor zone.

4. A thermoelement assembly wherein a plurality of individual thermoelement arrangements of claim 1 are connected in series, the respective said semiconductor zones of each such thermoelement arrangement being in a common semiconductor base and adjacent one face thereof in spaced, generally parallel relationship to one another, said opposite end in each respective such thermoelement, except for the last one of such thermoelements, being electrically connected to one end of said semiconductor zone in the thermoelement adjacent thereto, said assembly including a pair of assembly terminal contact means, one contact means of said pair being electrically conductively connected with said opposite end of said last one thermoelement, the other contact means of said pair being electrically conductively connected with said semiconductor zone generally remotely from such connection thereof.

5. A thermoelement arrangement of claim 1 wherein said electrically insulating layer is comprised of $SiO_2$.

6. A thermoelement arrangement of claim 1, wherein said conductor path comprises aluminum.

7. A thermoelement arrangement of claim 1, wherein said semiconductor body comprises n-conducting silicon.

8. A thermoelement arrangement of claim 1 wherein said semiconductor zone comprises p-doped silicon semiconductor material.

9. A two pole thermoelement consisting essentially of in integral combination
A. a base having a face,
B. an elongated semiconductor zone on said face, C. an elongated electrically insulating layer extending from a position over a first portion of one end region of said zone to a position generally adjacent the opposite end region of said zone, D. an elongated metallic electrically conductive layer arranged over said insulating layer and also, at one end area of said conductive layer, over a second portion of said one end region adjacent said insulating layer whereby said one end area is electrically conductively connected to said second portion, the opposite end area of said conductive layer being in spaced, adjacent relationship to said opposite end region, and E. two terminal electrically conductive contact means, one such contact means being on said opposite end portion, the other such contact means being on said opposite end area.

10. The thermoelement of claim 9 wherein said base is a semiconductor and said semiconductor zone is formed in said base adjacent said face and has a conductivity type opposite to that of said base.

11. The thermoelement of claim 9 wherein said base comprises a spinel.

12. The thermoelement of claim 9 wherein said base comprises a sapphire.

* * * * *